(12) United States Patent
Chimento et al.

(10) Patent No.: US 8,847,664 B2
(45) Date of Patent: Sep. 30, 2014

(54) GATE CONTROL CIRCUIT, POWER MODULE AND ASSOCIATED METHOD

(75) Inventors: Filippo Chimento, Vasteras (SE); Willy Hermansson, Vasteras (SE); Staffan Norrga, Stockholm (SE)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 14/004,630

(22) PCT Filed: Mar. 16, 2011

(86) PCT No.: PCT/EP2011/054007
§ 371 (c)(1),
(2), (4) Date: Sep. 11, 2013

(87) PCT Pub. No.: WO2012/123027
PCT Pub. Date: Sep. 20, 2012

(65) Prior Publication Data
US 2014/0028358 A1    Jan. 30, 2014

(51) Int. Cl.
*H03K 17/00* (2006.01)
*H02M 1/32* (2007.01)
*H03K 17/12* (2006.01)
*H03K 17/082* (2006.01)

(52) U.S. Cl.
CPC ............... *H03K 17/00* (2013.01); *H02M 1/32* (2013.01); *H03K 17/0828* (2013.01); *H03K 17/127* (2013.01)
USPC .......................................... 327/405; 327/478

(58) Field of Classification Search
CPC .............. H03K 17/08; H03K 17/0822; H03K 17/0826; H03K 17/0828; H03K 17/081; H03K 17/08104; H03K 17/08112; H03K 17/08116; H03K 17/0812; H03K 17/08122; H03K 17/08126; H03K 17/08128; H03K 17/0814; H03K 17/08142; H03K 17/08146; H03K 17/08148

USPC ......... 327/403–405, 427, 432, 434, 478, 482, 327/525, 574

See application file for complete search history.

(56) References Cited

U.S. PATENT DOCUMENTS 4,893,158 A * 1/1990 Mihara et al. ................. 257/341
7,005,739 B2   2/2006 Kaufmann et al.
(Continued)

FOREIGN PATENT DOCUMENTS

EP    0785625 A2    7/1997
JP    S6016171 A    1/1985
(Continued)

OTHER PUBLICATIONS

International Preliminary Report on Patentability Application No. PCT/EP2011/054007 Completed: Mar. 11, 2013 12 pages.

(Continued)

*Primary Examiner* — William Hernandez
(74) *Attorney, Agent, or Firm* — St. Onge Steward Johnston & Reens LLC

(57) ABSTRACT

A gate control circuit including: a gate input arranged to receive an input gate feed signal; a gate output arranged to be connected, during normal operation, to at least one switching module for controlling current through a main circuit, the gate output being connected to the gate input; a power supply; and a switch connected between the power supply and the gate output, the switch being arranged to close as a response to a failure. A corresponding power module and method are also presented.

18 Claims, 6 Drawing Sheets

(56) References Cited

U.S. PATENT DOCUMENTS

| | | | |
|---|---|---|---|
| 7,072,227 B2 * | 7/2006 | In-young | 365/189.02 |
| 7,570,101 B1 | 8/2009 | Short et al. | |
| 8,040,650 B2 * | 10/2011 | Ueda | 361/93.1 |
| 8,351,231 B2 * | 1/2013 | Tagome | 363/71 |
| 8,451,045 B2 * | 5/2013 | Yim et al. | 327/392 |
| 8,493,702 B2 * | 7/2013 | Nakahara | 361/93.9 |
| 8,698,549 B2 * | 4/2014 | Souma | 327/525 |
| 2004/0027193 A1 | 2/2004 | Katoh et al. | |
| 2008/0084642 A1 | 4/2008 | Kato et al. | |

FOREIGN PATENT DOCUMENTS

| | | |
|---|---|---|
| JP | 2002281737 A | 9/2002 |
| JP | 2005051901 A | 2/2005 |

OTHER PUBLICATIONS

International Search Report & Written Opinion of the International Searching Authority Application No. PCT/EP2011/054007 Completed: Jan. 19, 2012; Mailing Date: Feb. 1, 2012 7 pages.

* cited by examiner

GATE CONTROL CIRCUIT, POWER MODULE AND ASSOCIATED METHOD

TECHNICAL FIELD

The invention relates to control of switching modules used to control a current of a main circuit when a failure occurs.

BACKGROUND

Power modules can be used to control a main current, e.g. in a power converter such as an inverter or rectifier. In effect they behave like a transistor, where a control signal can alter the state of the power module between a conducting and a blocking state. The power module, in turn, can comprise a number of power switches, such as IGBTs (insulated-gate bipolar transistors) arranged in parallel to act on a provided control signal. A gate unit can also be provided to provide a suitable signal to the actual power switches based on the control signal provided to the power module.

A problem occurs if components such as a chip comprising a power switch or the gate unit of a power module fails. This can result in the power module becoming uncontrollable whereby the function of a circuit in which the power module is installed can stop functioning. In some cases, secondary failures can occur, resulting in further damage to property or people, e.g. from a resulting fire.

It is thus desired to manage failures of such power modules better.

SUMMARY

An object of the invention is to improve how failures of power modules are managed.

A first aspect is a gate control circuit comprising: a gate input arranged to receive an input gate feed signal; a gate output arranged to be connected to, during normal operation, at least one switching module for controlling current through a main circuit, the gate output being connected to the gate input; a power supply; and a switch connected between the power supply and the gate output, the switch being arranged to close as a response to a failure.

Normal operation is here to be construed as a state when a connection between the gate output and a switching module has not been broken. In contrast, in a failure state, the connection between the gate output and one or more switching modules may have been broken.

By closing the switch as a response to a failure, the gate output feeds any connected switching modules with a signal to set the switching modules in a conducting state. This effects a short circuit failure mode providing a predictable and most often manageable behaviour of the connected switching modules. The failure can for example be a failure of a gate unit or power switch (of a chip) of a connected switching module.

The gate control circuit may further comprise: a plurality of switching module outputs each arranged to be connected to a respective switching module for controlling current through a main circuit; and a plurality of current disconnectors, each connected between a respective switching module output, and the gate output, wherein each one of the current disconnectors is arranged to assume a blocking state when a failure occurs in a corresponding switching module. Each current disconnector is in a conducting state when the corresponding switching module is not in a failed state.

By disconnecting a failed switching module, the failure is, at least to some degree, isolated to only the failed switching module. Furthermore, by the power supply being connected to gates of remaining, operating, switching modules, these are set in a conducting state, whereby the behaviour of a complete power module, comprising the gate control circuit and the switching modules, is in a predictable and manageable short circuit state until the failed component(s) are repaired or replaced.

The switch may be arranged to close as a response to any one of the switching modules failing as detected by a dropped voltage over the collector and emitter of switching modules.

Each one of the current disconnectors may be arranged to assume a blocking state when a current through the current disconnector exceeds a threshold current. When a fault occurs in a switching module, the gate current of the switching module often increases. This phenomenon can be used to achieve a robust way of disconnecting the faulty switching module, and only the faulty switching module.

The current disconnectors may be fuses or circuit breakers.

The power supply may comprise a power converter connected to the main circuit or the power supply may comprise a battery. These are secure ways of providing continuous voltage to the gates of the remaining operating switching modules without logic or active control. The gate control circuit may further comprise a Zener diode connected to between the gate output and the main circuit. The Zener diode can keep the gate voltage at a suitable level for keeping the operating switching modules in a conducting state.

The gate control circuit may further be arranged to inform an external system when a failure occurs. By informing an external system, further measures can be taken to compensate for the failure or repair/replace the failed component(s).

A second aspect is a power module comprising: a gate control circuit according to the first aspect and a plurality of switching modules connected to the switching module outputs of the gate control circuit.

The switching modules may be connected in parallel to the main circuit. This allows remaining, operating, switching modules to continue to be controlled to be in a conducting state when a failed switching module is disconnected.

Each one of the switching modules may comprise a plurality of power switches connected in parallel to the main circuit. This allows the switching module to handle a larger current through the main circuit by dividing the current between the power switches.

Each one of the power switches may be an insulated-gate bipolar transistor.

A third aspect is a method executed in a gate control circuit comprising a gate input, a power supply, a gate output connected to, during normal operation, at least one switching module for controlling current through a main circuit, the gate output being connected to the gate input. The method comprises the step of: closing the switch, arranged between the power supply and the gate output, as a response to a failure.

The method may further comprise the step of: setting, as a response to a switching module failing, a current disconnector corresponding to the switching module which has failed in a blocking state.

The method may further comprise the step of: as a response to the switching module failing, informing a control device about a non-controllable state of the gate control circuit.

It is to be noted that any feature of the first, second or third aspects may, when suitable, be applied to any other of these aspects.

Generally, all terms used in the application are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

The invention is now described, by way of example, with reference to the accompanying drawings, in which.

DETAILED DESCRIPTION

The invention will now be described more fully hereinafter with reference to the accompanying drawings, in which certain embodiments of the invention are shown.

This invention may, however, be embodied in many different forms and should not be construed as limited to the embodiments set forth herein; rather, these embodiments are provided by way of example so that this disclosure will be thorough and complete, and will fully convey the scope of the invention to those skilled in the art. Like numbers refer to like elements throughout the description.

Figures 1A, 1B:
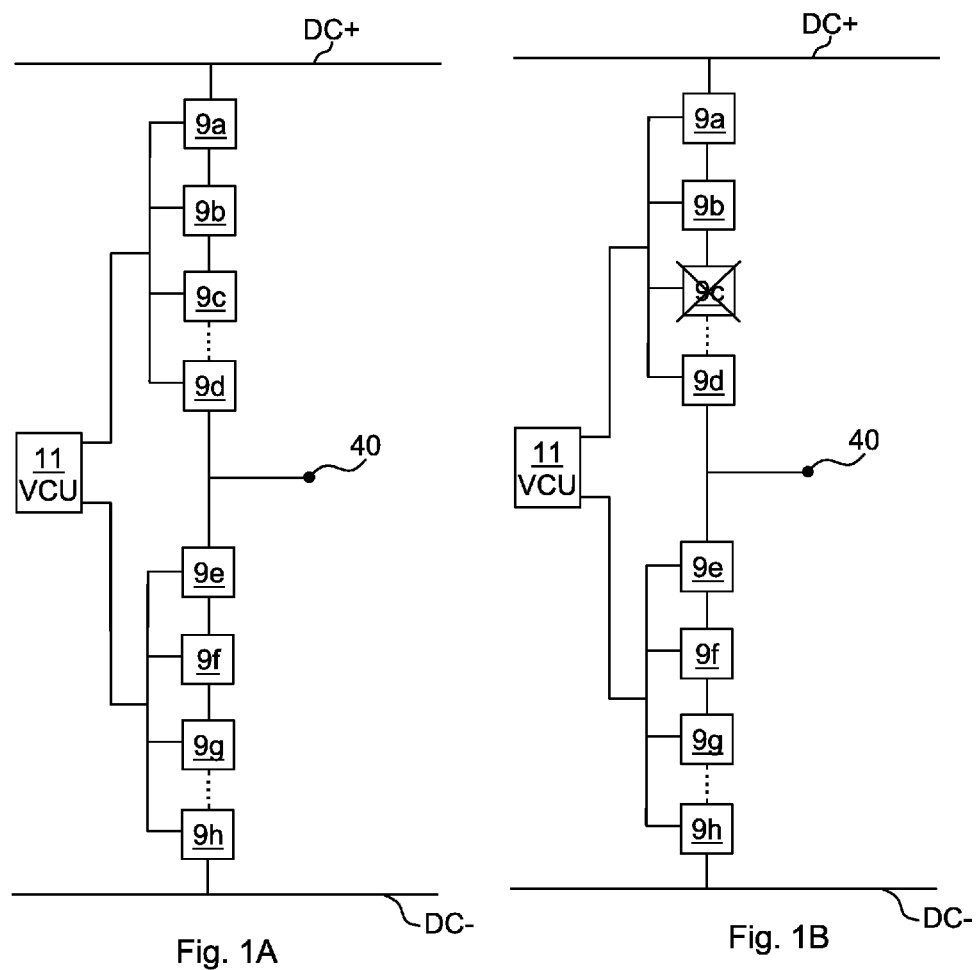
FIGS. 1A-B are schematic diagrams illustrating an environment where embodiments of the present invention can be applied.

FIGS. 1A-B are schematic diagrams illustrating an environment where embodiments of the present invention can be applied. A bridge leg in an inverter is shown for one phase. Additional phases (such as for a three phase system) are configured in the same way. DC power is supplied using a positive DC bus DC+ and a negative DC bus DC−. A valve control unit (VCU) 11 is connected to a plurality of power modules 9a-h. An upper part of the bridge leg comprises a first set of power modules 9a-9d, and a lower part of the bridge leg comprises a second set of power modules 9e-h. The first set of power modules 9a-9d are controlled by a first control signal from the VCU 11 and the second set of power modules 9e-9h are controlled by a second control signal from the VCU 11. This allows the VCU to e.g. effect pulse width modulation (PWM) to supply an alternating current to an output 40. By placing several power modules 9a-d, 9e-h in series, high voltage applications can be supported. It is to be noted that the number of power modules shown here is only an example and any suitable number of power modules can be used.

If now one power module fails, such as power module 9c of FIG. 1B, the circuit can still work as desired if the failed power module is set to conduct in a short circuit mode. As will be explained in further detail below, when a failure is detected in the power module, it is ensured that it is set to a short circuit failure mode where it continuously conducts. In other words, regardless of the signal from the VCU 11, the failed power module 9c will conduct. As long as there is some over-dimensioning in this configuration, the remaining power modules 9a-b, 9d-h operate as usual and provides the desired function until the failed power module 9c is replaced or repaired.

Another risk with a failed power module is that a discharge can occur if the failed power module breaks the circuit, which can lead to additional failed components and even fires.

So even in cases where a failed power module in most cases defaults to a short circuit state, it is valuable to provide additional measures to set the failed power module in short circuit failure mode.

There are many other topologies, such as H-bridge, half bridge, etc. where the same idea is useful, i.e. when a power module fails it should be set to a conducting state. However, depending on the topology, a control scheme of remaining, operating, power modules may need to be altered.

Figure 2A:
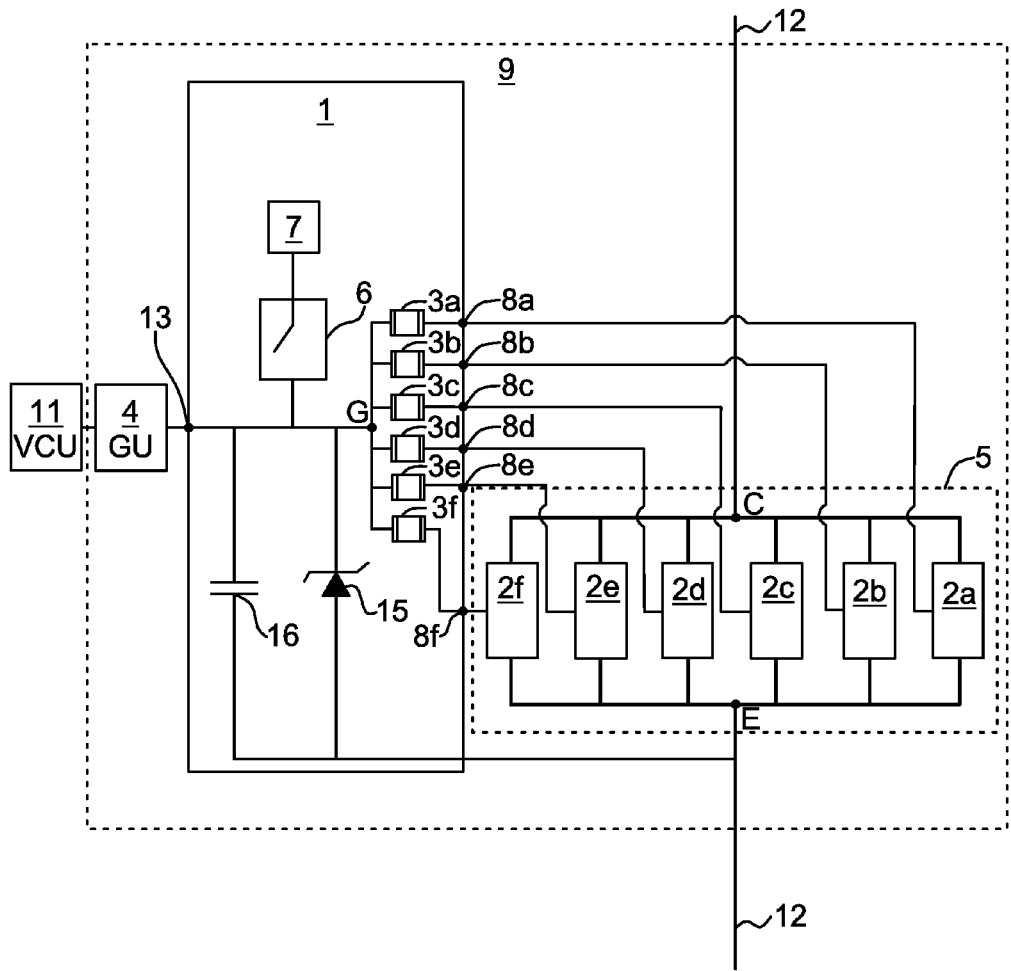
FIG. 2A is a schematic diagram illustrating components and interfaces of a power module of FIGS. 1A and 1B.

FIG. 2A is a schematic diagram illustrating components and interfaces of a power module 9 of FIGS. 1A and 1B. The power module 9, which, for instance, can be any one of the power modules 9a-h of FIGS. 1A-B, receives gate control signals from the VCU 11 to control a current through a main circuit 12.

A gate unit 4 acts as a driver, as known per se, to deliver an appropriate gate drive signal to a plurality of switching modules 2a-f arranged in parallel. Each one of the switching modules, as disclosed in detail with reference to FIG. 3 below, comprises one or more power switches, such as IGBTs. We can thus define a collector point C, an emitter point E and a gate point G. While it is here shown a set 5 of six switching modules, any number of switching modules can be used as long as, in this embodiment, there are at least two switching modules.

A gate control circuit 1 is here provided to set the power module 9 in a conducting state if a failure is detected, effecting a short circuit failure mode. The gate control circuit 1 comprises a power supply 7, a switch 6, a capacitor 16, a Zener diode 15 and a plurality of current disconnectors 3a-f, connected to respective switching modules 2a-f via respective switching module outputs 8a-f. A gate output G is point for a common gate signal to be supplied to any connected switching modules 2a-f. The switch 6 is connected between the power supply 7 and the gate output G and can be any suitable switch controllable between a conducting and a blocking state such as a transistor, etc. The Zener diode 15 is connected between the gate output G and an emitter side E of the switching modules 2a-f, i.e. the main circuit 12. The switching module outputs 8a-f are only abstract constructions and do not need to have any physical correspondence other than being any point between a current disconnector and a gate of a switching module. A gate input 13 is also provided, being any point between the output of the gate unit 4 and the gate output G. The power supply 7 can comprise a connection to the main circuit using a converter and/or it can comprise a battery. Alternatively or additionally, the power supply can comprise alternative power transfer means such as inductive power transfer. The capacitor keeps the voltage essentially constant at the level governed by the Zener diode 15.

The current disconnectors 3a-f have the ability to disconnect any current passing through them, i.e. go from a conducting state to a blocking state. The current disconnector can be passive devices such as fuses or circuit breakers or they can be active devices such as transistors, e.g. MOSFETs. In any case there is an individual control to disconnect the signal to the failed switching module, since a controlling voltage of other switching modules can otherwise be difficult or impossible to maintain. Hence if the current disconnectors 3a-f are transistors, the control signal to set the disconnectors in a blocking state can be caused by an excess current (a current greater than a threshold value) to a particular failed switching module.

During normal operation, the gate control circuit 1 is inactive and simply distributes, through its structure, an input gate feed signal received from the gate unit 4 on the gate input 13 to the switching module outputs 8a-f for controlling the switching modules 2a-f.

However, when a failure occurs in one of the switching modules 2a-f and is not handled in other ways, two events occur in this embodiment. The first event is that the current disconnector connected to the failed switching module assumes a blocking state. This also disconnects the gate of the failed switching module, which could otherwise prevent control of the remaining switching modules in a conductive state. The second event is that the switch 6 goes to a conducting state, whereby the power supply 7 is connected to the gate of the remaining operating switching modules. Using Zener diode 15, the voltage level is regulated to an appropriate level for the gates of the switching modules to surpass a linear region of the power switches of the switching modules. For example, the voltage level can be a few volts, e.g. in the range of 3 to 25 volts, or when IGBTs are used as power switches, the voltage level can be in the region of 8 to 10 volts.

In other words, through this individual control of the switching modules, the gates of the remaining operating switching modules are driven to a conducting state, regardless of the input feed signal received from the gate unit 4. The gate unit 4 may still be functional or it can have failed. The continuous voltage on the gates G is provided without logic or active control, providing robust and predictable failure handling. In this situation, it is thus beneficial to set the whole power module 9 in a conducting state, i.e. short circuit failure mode. As explained with reference to FIGS. 1A-B above, the application of the power modules could thus still function normally until the power module 9 can be replaced or repaired.

Figure 2B:
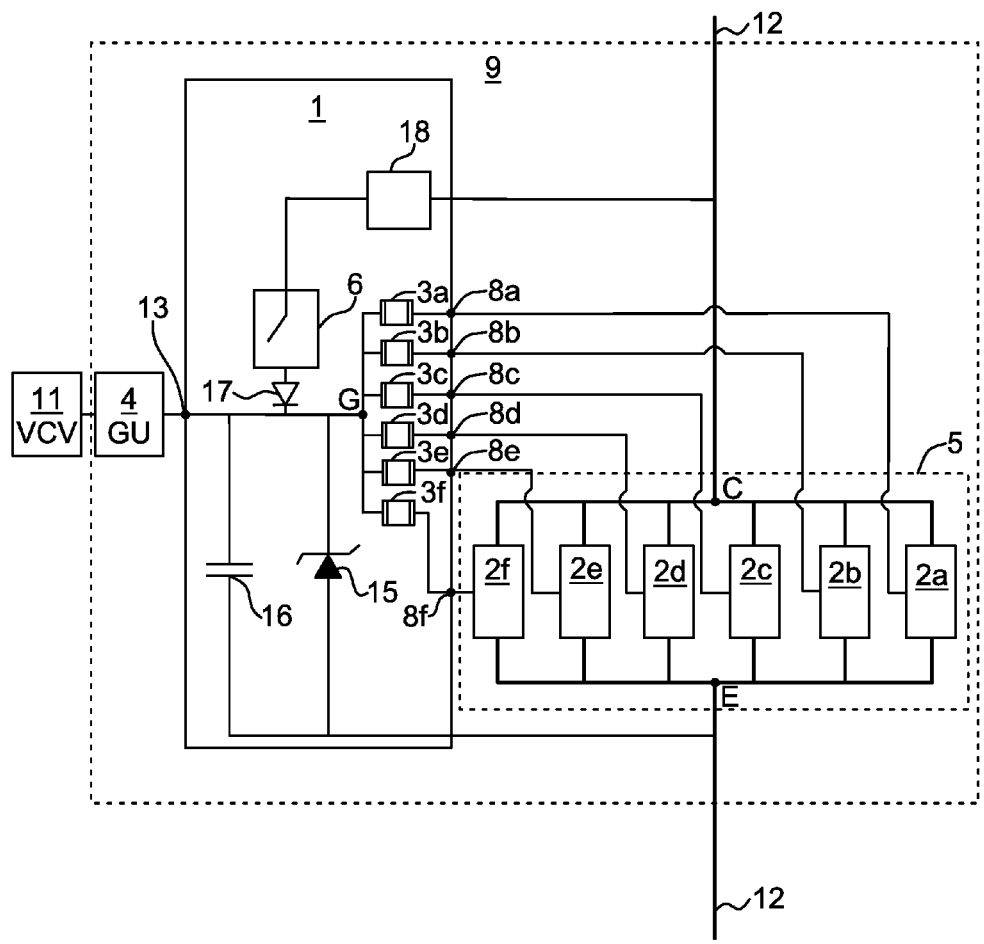
FIG. 2B is a schematic diagram illustrating components and interfaces of the power module of FIG. 2A where power is drawn from the main circuit.

FIG. 2B is a schematic diagram illustrating components and interfaces of the power module of FIG. 2A where power is drawn from the main circuit 12. A power converter 18 is connected to the main circuit, e.g. the collector side C of the set 5 of switching modules 2a-f. The power converter 18 converts the voltage to a suitable voltage level and may also optionally limit the power drawn from the main circuit 12. In other words, the power converter 18 with its connection to the main circuit 12 corresponds to the power supply 7 of FIG. 2A. The power converter 18 can e.g. be a DC/DC converter, a potential divider or a large resistor.

The power converter 18 also provides a robust way of keeping the gates of the operating switching modules supplied with sufficient voltage. If the gate voltage starts to fall over operating SCFM (Short Circuit Failure Mode) switching modules, the voltage between the collector C and emitter E will start to build up. This will allow power to again flow through the power converter 18 to charge the capacitor 16. In other words, the power converter 18 provides continuous voltage on the gates G without logic or active control, to thereby set the operating switching modules in short circuit failure mode.

Figure 2C:
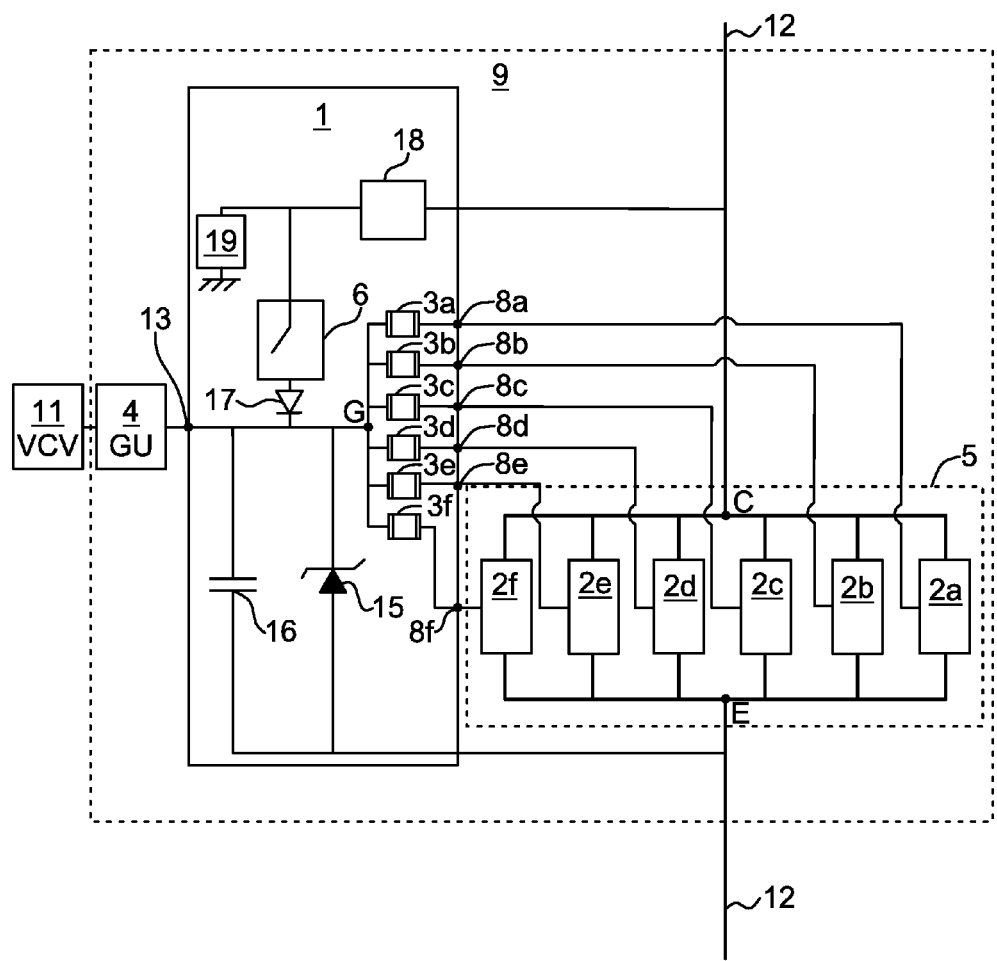
FIG. 2C is a schematic diagram illustrating components and interfaces of the power module of FIG. 2B further comprising a battery.

FIG. 2C is a schematic diagram illustrating components and interfaces of the power module of FIG. 2B further comprising a battery. The battery 19 can optionally be charged from the power converter 18. In this way, the gate G can be supplied with power regardless of the voltage on the collector side C of the set 5 of switching modules 2a-f. Optionally, a diode 17 is provided to prevent any current flowing from the gate side G to the collector side C.

Figure 3:
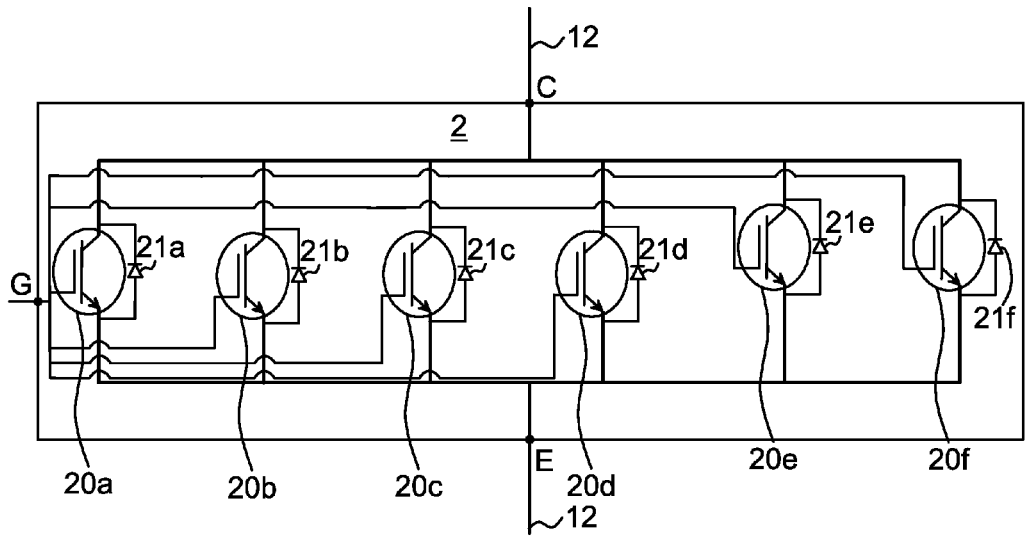
FIG. 3 is a schematic diagram illustrating one of the switching modules of FIGS. 2A-C.

FIG. 3 is a schematic diagram illustrating one switching module 2 of the switching modules 2a-f of FIGS. 2A-C. All switching modules 2a-f can be configured in the same way.

The switching module 2 comprises one or more power switches 20a-f connected in parallel to control a current through the main circuit 12. In this way a single signal provided on the gate G controls all power switches 20a-f to be in a conducting state, where any current of the main circuit 12 can flow through the switching module 2, or a blocking state where the main circuit 12 is blocked. The power switches 20a-f can be chips comprising IGBTs or power MOSFETs or any other controllable power switch capable of being controlled between a conducting and a blocking state.

Freewheeling diodes 21a-f are connected anti-parallel to each power switch 20a-f.

While the switching module 2 is here shown with six power switches 20a-f, any number of switches can be provided as considered suitable. Moreover, the number of power switches 20a-f of the switching module is independent from and does not need to be the same as the number of switching modules of a power module.

Figure 4:
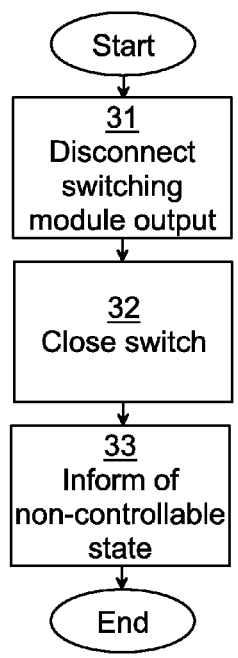
FIG. 4 is a flow chart illustrating a method performed using a gate control circuit of FIGS. 2A-C.

FIG. 4 is a flow chart illustrating a method performed using a gate control circuit of FIGS. 2A-C. The method is started when a switching module fails and needs to be handled.

In an optional disconnect switching module output step 31, as a response to the switching module failing, a current disconnector corresponding to the switching module which has failed is set in a blocking state. This can be a passive action, where the current disconnector is a fuse or circuit breaker. In that case, the current to the gate of the failed switching module increases to a level which blows the fuse or trips the circuit breaker. Alternatively, this can be effected using a transistor which is set to a blocking state. In either case, the gate of the failed switching module is disconnected from any control signal when this step is executed.

In a close switch step 32, the switch arranged between the power supply and the gate output G is closed, as a response to one or more components of the power module failing. This can be detected by a dropped voltage between the collector and emitter of the connected switching modules and/or a dropped voltage between the gate and emitter. The dropped voltages can for instance be detected by comparing the respective voltages with reference values. Additionally or alternatively, a signal indicating a failure of the gate unit can control the switch to close. This signal can be an explicit failure signal or an absence of a heartbeat signal.

In an optional inform of non-controllable state step 33, the gate control circuit informs an external control device of a non-controllable state of the gate control circuit. By informing the external control device, the failure is made known, e.g. in an operation and maintenance system. Furthermore, the switching scheme could be altered for power modules unaffected by the failure. This step can be effected by a signal being sent informing the receiver of the failure. Alternatively or additionally, an absence of a heartbeat signal sent whenever everything is normal can indicate the failure. This signal can coincide with the signal used to detect the failure of the gate unit as explained in the close switch step 32.

Figure 5:
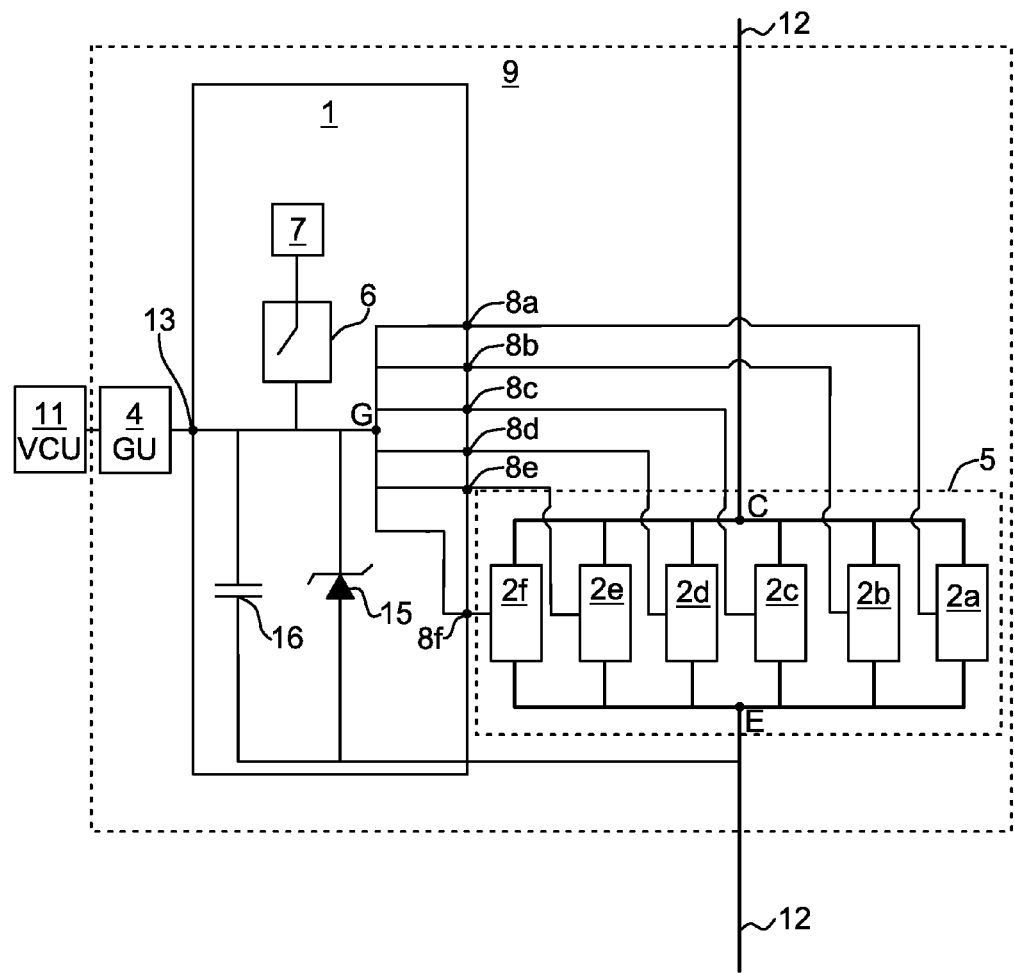
FIG. 5 is a schematic diagram illustrating the power module of FIG. 2A in an embodiment without the current disconnectors.

FIG. 5 is a schematic diagram illustrating the power module of FIG. 2A in an embodiment without the current disconnectors. The switch 6 is also here arranged to close when a failure is detected, e.g. if the gate unit 4 fails, in which situation the behaviour of the power module 9 is unpredictable. Analogously to what is disclosed above, the power module is set to the short circuit failure mode by closing the switch 6.

The power supply 7 thus provides a gate signal to all of the switching module 2*a-f* to set them in a saturated conducting state.

The power supply 7 can be implemented using any of the options disclosed above. This embodiment is thus not arranged to disconnect any failed switching modules, but does manage the case when the gate unit fails.

While there are six switching modules 2*a-f* shown here, any number of switching modules can be provided, including a single switching module.

The invention has mainly been described above with reference to a few embodiments. However, as is readily appreciated by a person skilled in the art, other embodiments than the ones disclosed above are equally possible within the scope of the invention, as defined by the appended patent claims.

The invention claimed is:

1. A gate control circuit comprising:
    a gate input arranged to receive an input gate feed signal;
    a gate output arranged to be connected, during normal operation, to a plurality of switching modules for controlling current through a main circuit, the gate output being connected to the gate input;
    a power supply; and
    a switch connected between the power supply and the gate output, the switch being arranged to close as a response to a failure for setting connected switching modules in a conducting state.

2. The gate control circuit according to claim 1, further comprising:
    a plurality of switching module outputs each arranged to be connected to a respective switching module for controlling current through a main circuit; and
    a plurality of current disconnectors, each connected between a respective switching module output, and the gate output, wherein each one of the current disconnectors is arranged to assume a blocking state when a failure occurs in a corresponding switching module.

3. The gate control circuit according to claim 2, wherein the switch is arranged to close as a response to any one of the switching modules failing as detected by a dropped voltage over the collector and emitter of the switching modules.

4. The gate control circuit according to claim 2, wherein each one of the current disconnectors is arranged to assume a blocking state when a current through the current disconnector exceeds a threshold current.

5. The gate control circuit according to claim 2, wherein the current disconnectors are fuses.

6. The gate control circuit according to claim 2, wherein the current disconnectors are circuit breakers.

7. The gate control circuit according to claim 1, wherein the power supply comprises a power converter connected to the main circuit.

8. The gate control circuit according to claim 1, wherein the power supply comprises a battery.

9. The gate control circuit according to claim 1, further comprising a Zener diode connected between the gate output and the main circuit.

10. The gate control circuit according to claim 1, wherein the gate control circuit is further arranged to inform an external system when a failure occurs.

11. A power module comprising:
    a gate control circuit according to claim 2; and
    a plurality of switching modules connected to the switching module outputs of the gate control circuit.

12. A power module comprising:
    a gate control circuit according to claim 1; and
    a plurality of switching modules connected to the gate output of the gate control circuit.

13. The power module according to claim 11, wherein the switching modules are connected in parallel to the main circuit.

14. The power module according to claim 11, wherein each one of the switching modules comprises a plurality of power switches connected in parallel to the main circuit.

15. The power module according to claim 14, wherein each one of the power switches is an insulated-gate bipolar transistor.

16. A method executed in a gate control circuit comprising a gate input, a power supply, a gate output connected, during normal operation, to a plurality of switching modules for controlling current through a main circuit, the gate output being connected to the gate input, the method comprising the step of:
    closing a switch, arranged between the power supply and the gate output, as a response to a failure for setting connected switching modules in a conducting state.

17. The method according to claim 16, further comprising the step of:
    setting, as a response to a switching module failing, a current disconnector corresponding to the switching module which has failed in a blocking state.

18. The method according to claim 16, further comprising the step of:
    as a response to the switching module failing, informing a control device about a non-controllable state of the gate control circuit.

* * * * *